United States Patent
Gabriel, III et al.

(10) Patent No.: US 10,126,351 B2
(45) Date of Patent: Nov. 13, 2018

(54) SYSTEMS AND METHODS FOR PLACEMENT OF SINGULATED SEMICONDUCTOR DEVICES FOR MULTI-SITE TESTING

(71) Applicant: Cirrus Logic, Inc., Austin, TX (US)

(72) Inventors: Martin Joseph Gabriel, III, Austin, TX (US); Jason Hwang, Taipei (TW)

(73) Assignee: Cirrus Logic, Inc., Austin, TX (US)

( * ) Notice: Subject to any disclaimer, the term of this patent is extended or adjusted under 35 U.S.C. 154(b) by 244 days.

(21) Appl. No.: 14/720,304

(22) Filed: May 22, 2015

(65) Prior Publication Data
US 2015/0338453 A1 Nov. 26, 2015

Related U.S. Application Data

(60) Provisional application No. 62/002,701, filed on May 23, 2014.

(51) Int. Cl.
*G01R 31/26* (2014.01)
*G01R 31/02* (2006.01)
*G01R 1/073* (2006.01)
*G01R 31/28* (2006.01)

(52) U.S. Cl.
CPC .......... *G01R 31/26* (2013.01); *G01R 1/073* (2013.01); *G01R 31/02* (2013.01); *G01R 31/2894* (2013.01)

(58) Field of Classification Search
None
See application file for complete search history.

(56) References Cited

U.S. PATENT DOCUMENTS

| | | | | | |
|---|---|---|---|---|---|
| 5,844,803 | A | * | 12/1998 | Beffa | G01R 31/2894 700/108 |
| 6,563,331 | B1 | * | 5/2003 | Maeng | G01R 1/0408 209/574 |
| 6,903,567 | B2 | * | 6/2005 | Chung | G01R 31/2893 324/757.01 |
| 7,155,361 | B2 | * | 12/2006 | Huang | G01R 31/2894 702/117 |
| 7,208,969 | B2 | * | 4/2007 | Golan | G01R 31/2894 324/754.03 |
| 7,237,160 | B2 | * | 6/2007 | Lu | G01R 31/2894 702/117 |

(Continued)

OTHER PUBLICATIONS

International Search Report and Written Opinion, International Patent Application No. PCT/US2015/032270, dated Sep. 22, 2015, 9 pages.

*Primary Examiner* — Paresh Patel
(74) *Attorney, Agent, or Firm* — Jackson Walker L.L.P.

(57) ABSTRACT

Systems and methods for multi-site placement of singulated semiconductor devices are presented. The systems and methods for multi-site placement may facilitate multi-site testing of the singulated semiconductor devices. A method may include determining a quantity of singulated semiconductor devices to be arranged in a test configuration. The method may also include determining, using a data processing device, a test configuration in response to the quantity. In further embodiments, the method may include placing the singulated semiconductor devices in a test frame according to the test configuration.

16 Claims, 12 Drawing Sheets

(56) References Cited

U.S. PATENT DOCUMENTS

| | | | |
|---|---|---|---|
| 7,299,388 B2 * | 11/2007 | Ung | G01R 31/31722 365/201 |
| 2005/0275421 A1 | 12/2005 | Schuette et al. | |
| 2007/0063721 A1 | 3/2007 | Dozier, II et al. | |
| 2008/0281545 A1 | 11/2008 | McIntyre et al. | |
| 2009/0058451 A1 | 3/2009 | Muradali | |
| 2010/0117084 A1 * | 5/2010 | Konno | H01L 22/20 257/48 |

* cited by examiner

FIG. 12

|  | -10 | -9 | -8 | -7 | -6 | -5 | -4 | -3 | -2 | -1 | 0 | 1 | 2 | 3 | 4 | 5 | 6 | 7 | 8 | 9 | 10 |
|---|---|---|---|---|---|---|---|---|---|---|---|---|---|---|---|---|---|---|---|---|---|
| -1 |  |  |  |  |  |  |  |  | x | x | x | x | x |  |  |  |  |  |  |  |  |
| 0 |  |  |  |  |  | x | x | 0 | 0 | 0 | 0 | 0 | x | x |  |  |  |  |  |  |  |
| 1 |  |  |  |  | x | 0 | 0 | 0 | 0 | 0 | 0 | 0 | 0 | 0 | x |  |  |  |  |  |  |
| 2 |  |  |  | x | 0 | 0 | 0 | 0 | 0 | 0 | 0 | 0 | 0 | 0 | 0 | x |  |  |  |  |  |
| 3 |  |  | x | 0 | 0 | 0 | 0 | 0 | 0 | 0 | 0 | 0 | 0 | 0 | 0 | 0 | x |  |  |  |  |
| 4 |  | x | 0 | 0 | 0 | 0 | 0 | 0 | 0 | 0 | 0 | 0 | 0 | 0 | 0 | 0 | 0 | x |  |  |  |
| 5 | x | 0 | 0 | 0 | 0 | 0 | 0 | 0 | 0 | 0 | 0 | 0 | 0 | 0 | 0 | 0 | 0 | 0 | x |  |  |
| 6 |  | x | 0 | 0 | 0 | 0 | 0 | 0 | 0 | 0 | 0 | 0 | 0 | 0 | 0 | 0 | 0 | 0 | x |  |  |
| 7 | x | 0 | 0 | 0 | 0 | 0 | 0 | 0 | 0 | 0 | 0 | 0 | 0 | 0 | 0 | 0 | 0 | 0 | 0 | 0 | x |
| 8 | x | 0 | 0 | 0 | 0 | 0 | 0 | 0 | 0 | 0 | 0 | 0 | 0 | 0 | 0 | 0 | 0 | 0 | 0 | 0 | x |
| 9 | x | 0 | 0 | 0 | 0 | 0 | 0 | 0 | 0 | 0 | 0 | 0 | 0 | 0 | 0 | 0 | 0 | 0 | 0 | 0 | x |
| 10 | x | 0 | 0 | 0 | 0 | 0 | 0 | 0 | 0 | 0 | 0 | 0 | 0 | 0 | 0 | 0 | 0 | 0 | 0 | 0 | x |
| 11 | x | 0 | 0 | 0 | 0 | 0 | 0 | 0 | 0 | 0 | 0 | 0 | 0 | 0 | 0 | 0 | 0 | 0 | 0 | 0 | x |
| 12 |  | x | 0 | 0 | 0 | 0 | 0 | 0 | 0 | 0 | 0 | 0 | 0 | 0 | 0 | 0 | 0 | 0 | 0 | x |  |
| 13 |  | x | 0 | 0 | 0 | 0 | 0 | 0 | 0 | 0 | 0 | 0 | 0 | 0 | 0 | 0 | 0 | 0 | 0 | x |  |
| 14 |  |  | x | 0 | 0 | 0 | 0 | 0 | 0 | 0 | 0 | 0 | 0 | 0 | 0 | 0 | 0 | 0 | x |  |  |
| 15 |  |  | x | 0 | 0 | 0 | 0 | 0 | 0 | 0 | 0 | 0 | 0 | 0 | 0 | 0 | 0 | x |  |  |  |
| 16 |  |  |  | x | 0 | 0 | 0 | 0 | 0 | 0 | 0 | 0 | 0 | 0 | 0 | 0 | x |  |  |  |  |
| 17 |  |  |  | x | 0 | 0 | 0 | 0 | 0 | 0 | 0 | 0 | 0 | 0 | 0 | x |  |  |  |  |  |
| 18 |  |  |  |  | x | x | 0 | 0 | 0 | 0 | 0 | x | x |  |  |  |  |  |  |  |  |
| 19 |  |  |  |  |  |  |  | x | x | x | x | x |  |  |  |  |  |  |  |  |  |

SYSTEMS AND METHODS FOR PLACEMENT OF SINGULATED SEMICONDUCTOR DEVICES FOR MULTI-SITE TESTING

FIELD

This disclosure relates generally to semiconductor devices, and more specifically, to systems and methods for placement of singulated semiconductor devices for multi-site testing.

BACKGROUND

A semiconductor device supply chain often involves a multiple number of different parties. For example, a semiconductor design company may provide a semiconductor design layout to a semiconductor manufacturer. The semiconductor manufacturer may fabricate the semiconductor devices on semiconductor wafers. The semiconductor manufacturer may provide the wafers to a device assembler for device singulation and packaging. During the assembly process, the device assembler may test the singulated semiconductor devices to ensure that the singulated semiconductor devices are operable. In other supply chain models, the device assembler may provide packages of singulated semiconductor devices to a device tester for independent testing.

Semiconductor devices can be packaged for shipping by taping the semiconductor devices in tape strips and rolling the tape strips onto reels. As used herein, the term "package" refers to a shipping package for shipping singulated semiconductor devices, rather than a semiconductor chip package comprising the housing and external electrical connections for interfacing with the semiconductor device. Alternatively, the semiconductor devices can be packaged for shipping in waffle packs, trays, or the like. Prior methods of device testing include testing the singulated semiconductor devices one by one with a single site testing probe.

SUMMARY

Systems and methods for multi-site placement of singulated semiconductor devices are presented. In further embodiments, the systems and methods for multi-site placement may facilitate multi-site testing of the singulated semiconductor devices. In accordance with embodiments of the present disclosure, a method includes determining a quantity of singulated semiconductor devices to be arranged in a test configuration. The method may also include determining, using a data processing device, a test configuration in response to the quantity. In further embodiments, the methods may include placing the singulated semiconductor devices in a test frame according to the test configuration.

Some embodiments of the method may also include determining a test probe configuration to be used for testing of the singulated semiconductor devices, and identifying a test configuration that enhances utilization of the test probe. Additionally, the method may include optimizing the test configuration to minimize a cost of testing the singulated semiconductor devices. In some of such embodiments, determining the test configuration may include determining a spacing between the singulated semiconductor devices.

In some embodiments of the method, the method may include generating a frame map in response to the test configuration, the frame map defining an arrangement of the singulated semiconductor devices on a test frame. Generating the frame map may further include identifying a spacing of the singulated semiconductor devices along a first axis of the frame. In other embodiments of the method, generating the frame map may include identifying a spacing of the singulated semiconductor devices along a second axis of the frame. In yet other embodiments of the method, generating the frame map may include identifying a radial position of the singulated semiconductor devices with reference to a reference point on the frame.

In some embodiments of the method, the method may also include determining a quantity of singulated semiconductor devices in a lot set of singulated semiconductor devices. The method may also include designating the singulated semiconductor devices as scrap in response to a determination that the quantity is below a threshold value. Additionally, the method may include designating the singulated semiconductor devices as scrap in response to a determination that an expected test yield has not met a threshold value. In some embodiments, the method may include placing the singulated semiconductor devices according to the test configuration. The method may also include testing a set of singulated semiconductor devices, the set of singulated semiconductor devices being arranged according to the test configuration.

In accordance with these and other embodiments of the present disclosure, a system may include a processing device configured to receive a quantity of singulated semiconductor devices to be arranged in an array, and determine, using a data processing device, a test configuration in response to the quantity. The system may also include a placement device configured to place the singulated semiconductor devices in a test frame according to the test configuration. Additionally, in some embodiments the system may include a multi-site test probe configured to contact the singulated semiconductor devices and conduct an electrical test on multiple singulated semiconductor devices simultaneously.

The system may further include a shipping package separator configured to separate a first set of singulated semiconductor devices from a second set of singulated semiconductor devices. In such embodiments, the first set of singulated semiconductor devices may be manufactured in a first lot and the second set of singulated semiconductor devices may be manufactured in a second lot.

In some embodiments, the system may also include a test device configured to test the singulated semiconductor devices in the test frame. The test device may include a test probe. Additionally, the processing device may be configured to determine the test configuration in response to a configuration of the test probe.

Technical advantages of the present disclosure may be readily apparent to one having ordinary skill in the art from the figures, descriptions and claims included herein. The objects and advantages of the embodiments will be realized and achieved at least by the elements, features, and combinations particularly pointed out in the claims.

It is to be understood that both the foregoing general description and the following detailed description are explanatory examples and are not restrictive of the claims set forth in the disclosure.

BRIEF DESCRIPTION OF THE DRAWINGS

The present disclosure is illustrated by way of example and is/are not limited by the accompanying figures, in which like references indicate similar elements. Elements in the figures are illustrated for simplicity and clarity and have not necessarily been drawn to scale.

FIG. 12 is a diagram illustrating another example of a frame map for multi-site placement of singulated semiconductor devices, in accordance with embodiments of the present disclosure, in accordance with embodiments of the present disclosure.

DETAILED DESCRIPTION

Figure 1:
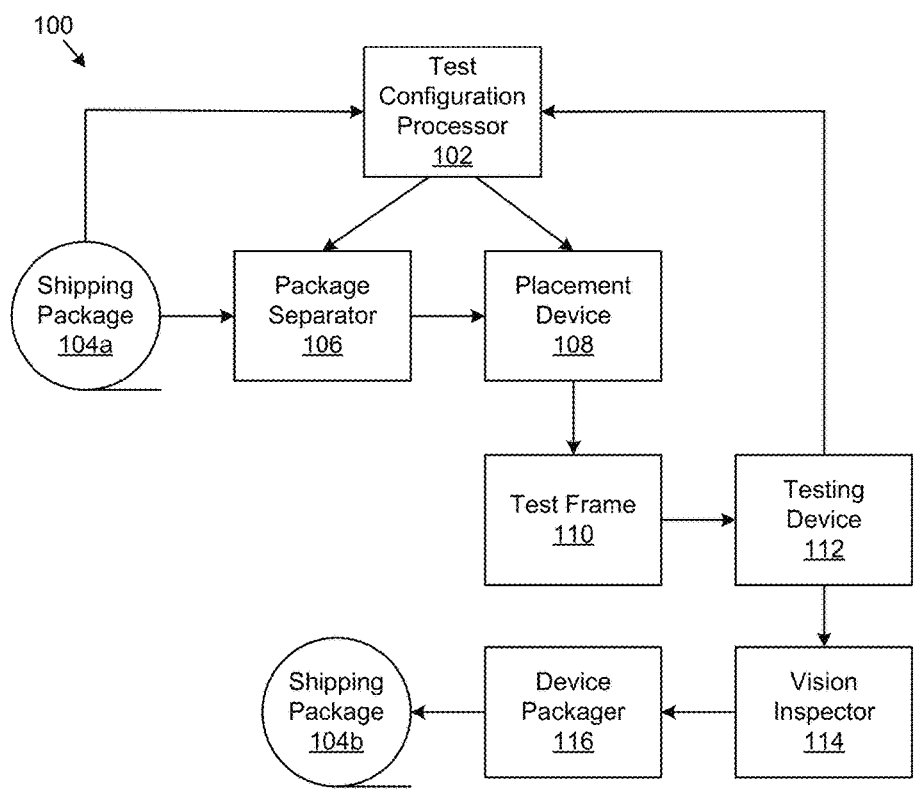
FIG. 1 is a schematic block diagram illustrating an example system for multi-site placement of singulated semiconductor devices, in accordance with embodiments of the present disclosure.

FIG. 1 is a schematic block diagram illustrating embodiments of a system for multi-site placement of singulated semiconductor devices, in accordance with embodiments of the present disclosure. As shown in FIG. 1, system 100 may include a test configuration processor 102. Test configuration processor 102 may receive information about a shipping package 104a and about a testing device 112 and generate a test configuration for placing the singulated semiconductor devices from the shipping package 104a in a test frame 110 that may at least be generally wafer-shaped for multi-site testing. For example, test configuration processor 102 may receive a quantity of singulated semiconductor devices to be arranged. Test configuration processor 102 may then determine the test configuration in response to the quantity as well as a configuration of the test probe to be used in testing device 112. The test probe configuration information may include the number, orientation, dimensions, and spacing of contact sites on the test probe.

In certain embodiments, shipping package 104a may be a multi-lot package, meaning that singulated semiconductor devices that were manufactured in different lots are included in the same shipping package 104a. In some embodiments, the lots may be separated by a package separator 106. In these and other embodiments, test configuration processor 102 may use lot information to instruct package separator 106 on how to separate the singulated semiconductor devices in shipping package 104a. In alternative embodiments, package separator 106 may automatically determine the lot information, for example using shipping and packaging information imprinted on shipping package 104a, or the like. In such embodiments, shipping package separator 106 may provide the lot information to test configuration processor 102, which may use the lot information to update the test configuration. For example, the lot information may modify the quantity information received by test configuration processor 102.

In embodiments, test configuration processor 102 may determine a test configuration for placement of the singulated semiconductor devices. In such embodiments, test configuration processor 102 may provide the test configuration to a placement device 108. For example, test configuration processor 102 may provide the test configuration to placement device 108 via a direct peer-to-peer or network connection. Alternatively, test configuration processor 102 may generate a test configuration file, which may be uploaded or otherwise used to configure placement device 108.

Placement device 108 may then receive the singulated semiconductor devices from shipping package separator 106 or directly from shipping package 104a. Placement device 108 may be configured to place the singulated semiconductor devices on test frame 110 according to the test configuration provided by test configuration processor 102. Once the singulated semiconductor devices are placed in test frame 110, multi-point testing of the singulated semiconductor devices may be carried out by testing device 112. In such an embodiment, testing device 112 may use a multi-point test probe, that is, a point having multiple numbers of test points. After completion of the multi-point testing by testing device 112, the singulated semiconductor devices may be inspected by a vision inspector 114 and sent to a shipping device packager 116 for packaging for shipping in another shipping package 104b.

Beneficially, such a system and method may make use of industry standard multi-point testing systems for testing the singulated semiconductor devices in a way that is the same or similar to standard multi-point wafer testing. Thus, the present embodiments may not require intensive investment in new testing infrastructure or equipment. Additionally, the singulated semiconductor devices may be tested more efficiently, because of the parallel or multipoint testing capabilities of the present embodiments. Thus, time, resources, and money may be saved when the present embodiments are compared to previously-known methods of testing singulated semiconductor devices, such as individually testing singulated semiconductor devices.

Figure 2:
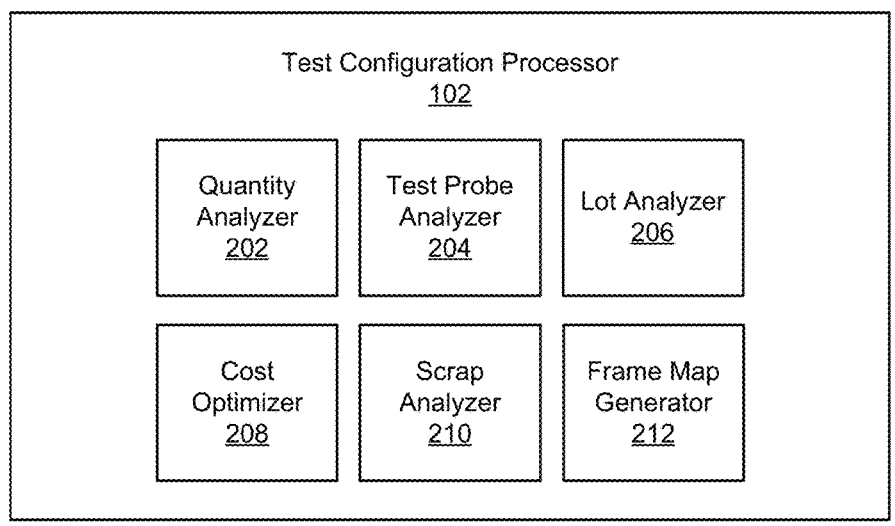
FIG. 2 is a schematic block diagram illustrating an example processing device for multi-site placement of singulated semiconductor devices, in accordance with embodiments of the present disclosure.

FIG. 2 is a schematic block diagram illustrating an example test configuration processor 102, in accordance with embodiments of the present disclosure. As shown in FIG. 2, test configuration processor 102 may include a quantity analyzer 202, a test probe analyzer 204, a lot analyzer 206, a optimizer 208, a scrap analyzer 210, and a frame map generator 212.

Quantity analyzer 202 may include an interface component for receiving quantity information from a user or directly from shipping package 104a. For example, shipping package 104a may include a label, bar code, radio-frequency identification tag (RFID), or the like which may be used to convey quantity information to the quantity analyzer 202. Quantity analyzer 202 may then use the quantity information to determine a group size for the test configuration. Determining the group size may include determining a number of singulated semiconductor devices to place on each test frame 110. In another embodiment, quantity analyzer 202 may include a quantity entry field in a graphical user interface for allowing a user to enter the quantity information.

Test probe analyzer 204 may receive information regarding the test probe used by testing device 112. Test probe information may include a description of the number of test sites in the test probe, a spacing of the test sites, a size or orientation of the test sites, etc. For example, a test site may comprise a probe contact point for creating an electrical contact with the singulated semiconductor devices. Test probe information may additionally or alternatively include a placement or orientation tolerance value. The tolerance value may be used to determine a degree of exactness with which the singulated semiconductor devices must be placed on test frame 110. In some embodiments, test probe analyzer 204 may receive the test probe information from testing device 112. In other embodiments, test probe analyzer 204 may receive the information from a user via a graphical user interface. In still a further embodiment, the information may be stored in a database of test probe information, and a subset of the information may be selected by a user.

Lot analyzer 206 may be configured to modify the quantity information. For example, if shipping package 104a includes one thousand (1000) singulated semiconductor devices, but the semiconductor devices are received from two distinct lots, lot analyzer 206 may amend the quantity received by quantity analyzer 202 to adjust the analysis so that only devices from a single lot are considered. The lot analyzer information may receive the lot information from a user via a user interface, from information on shipping package 104a, from shipping package separator 106, from vision inspector 114 (e.g., inspection), and/or another component of system 100.

Optimizer 208 may use one or more pre-programmed algorithms to determine an optimal test configuration. For example, processor time may be a primary source of test cost, and thus it may be beneficial from a cost perspective to ensure that every touch point of a test probe contacts a singulated semiconductor device on each test site of the probe. Thus, no processor time is wasted. In such embodiments, optimizer 208 may use the quantity information, the test probe information, and/or cost information to determine an optimum test configuration for placing the semiconductor devices on the wafer-level test frame 110 from a test perspective. Additional details of example test configurations which may be used for optimization of costs are described in FIGS. 9-11.

Scrap analyzer 210 may use quantity information and cost information to determine whether a portion of the singulated semiconductor devices should be discarded as scrap. For example, if a quantity of singulated semiconductor devices in a particular lot is so low that it would be inefficient to place them in a test frame 110 and test them with testing device 112, then that lot may be discarded as scrap. Scrap analyzer 210 may designate the lot as scrap and display such a designation to the user or indicate that a particular lot is scrap to placement device 108.

Frame map generator 212 may then use information collected and analyzed by quantity analyzer 202, test probe analyzer 204, lot analyzer 206, optimizer 208, and/or scrap analyzer 210 to generate a frame map according to the determined test configuration. The frame map may provide placement instructions for placement device 108, or for a user, which indicate the appropriate placement of singulated semiconductor devices within test frame 110. An example of a frame map is illustrated in FIG. 12.

Figure 3:
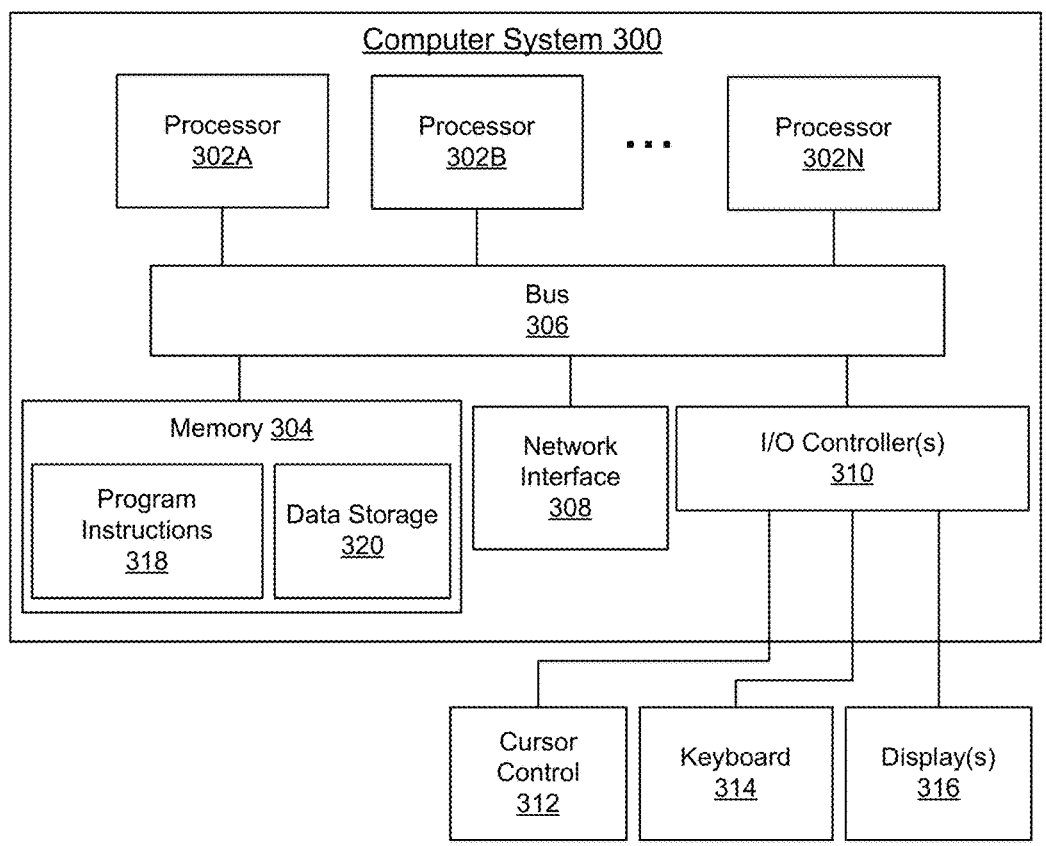
FIG. 3 is a schematic block diagram illustrating an example of a data processing system for multi-site placement of singulated semiconductor devices, in accordance with embodiments of the present disclosure.

FIG. 3 is a schematic block diagram illustrating an example data processing system 300 configurable for multi-site placement of singulated semiconductor devices, in accordance with embodiments of the present disclosure. In some embodiments, test configuration processor 102 may be implemented on a computer system similar to the data processing system 300 described in FIG. 3. In various embodiments, data processing system 300 may be a server, a mainframe computer system, a workstation, a network computer, a desktop computer, a laptop, or the like.

As illustrated in FIG. 3, data processing system 300 may include one or more processors 302A-N coupled to a system memory 304 via a bus 306. Data processing system 300 may further include a network interface 308 coupled to bus 306, and one or more input/output (I/O) controller(s) 310 coupled to devices such as a cursor control device 312, a keyboard 314, and one or more displays 316. In some embodiments, a given entity (e.g., test configuration processor 102) may be implemented using a single instance of data processing system 300, while in other embodiments, multiple data processing systems 300, or multiple nodes making up data processing system 300, may be configured to host different portions or instances of components of system 100 (e.g., a portion of system 100 may be implemented at a semiconductor device design company, while other portions may be implemented at a testing or manufacturing facility).

Data processing system 300 may comprise a single-processor system including one processor 302A, or a multi-processor system including two or more processors 302A-N (e.g., two, four, eight, or another suitable number). Processor(s) 302A-N may be any processor capable of executing program instructions. For example, in various embodiments, processor(s) 302A-N may be general-purpose or embedded processors implementing any of a variety of instruction set architectures (ISAs), such as the x86, POWERPC®, ARM®, SPARC®, or MIPS® ISAs, or any other suitable ISA. In multi-processor systems, each of processor(s) 302A-N may commonly, but not necessarily, implement the same ISA. Also, in some embodiments, at least one processor(s) 302A-N may be a graphics processing unit (GPU) or other dedicated graphics-rendering device.

System memory 304 may be configured to store program instructions and/or data accessible by processor(s) 302A-N. For example, memory 304 may be used to store one or more software programs for implementing the methods depicted in FIGS. 5-7. System memory 304 may be implemented using any suitable memory technology, such as static random access memory (SRAM), synchronous dynamic RAM (SDRAM), nonvolatile/Flash-type memory, or any other type of memory. As illustrated, program instructions and data implementing certain operations, such as, for example, those described above, may be stored within system memory 304 as program instructions 318 and data storage 320, respectively. In other embodiments, program instructions and/or data may be received, sent or stored upon different types of computer-accessible media or on similar media separate from system memory 304 or data processing system 300. Generally speaking, a computer-accessible medium may include any tangible, non-transitory storage media or memory media such as electronic, magnetic, or optical media-e.g., disk or CD/DVD-ROM coupled to data processing system 300 via bus 306, or non-volatile memory storage (e.g., "flash" memory)

The terms "tangible" and "non-transitory," as used herein, are intended to describe a computer-readable storage medium (or "memory") excluding propagating electromagnetic signals, but are not intended to otherwise limit the type of physical computer-readable storage device that is encompassed by the phrase computer-readable medium or memory. For instance, the terms "non-transitory computer readable medium" or "tangible memory" are intended to encompass types of storage devices that do not necessarily store information permanently, including for example, random access memory (RAM). Program instructions and data stored on a tangible computer-accessible storage medium in non-transitory form may further be transmitted by transmission media or signals such as electrical, electromagnetic, or digital signals, which may be conveyed via a communication medium such as a network and/or a wireless link.

Bus 306 may comprise any system, device, or apparatus configured to coordinate I/O traffic between processor 302, system memory 304, and/or any peripheral devices including network interface 308 or other peripheral interfaces, coupled via I/O controller(s) 310. In some embodiments, bus 306 may perform any necessary protocol, timing or other data transformations to convert data signals from one component (e.g., system memory 304) into a format suitable for use by another component (e.g., processor(s) 302A-N). In these and other embodiments, bus 306 may include support for devices attached through various types of peripheral buses, such as a variant of the Peripheral Component Interconnect (PCI) bus standard or the Universal Serial Bus (USB) standard, for example. In these and other embodiments, the operations of bus 306 may be split into two or more separate components, such as a north bridge and a south bridge, for example. In addition, in some embodiments some or all of the operations of bus 306, such as an interface to system memory 304, may be incorporated directly into processor(s) 302A-N.

Network interface 308 may comprise and system, device, or apparatus configured to allow data to be exchanged between data processing system 300 and other devices, such as other computer systems attached to test configuration processor 102, package separator 106 and/or placement device 108, for example. In various embodiments, network interface 308 may support communication via wired or wireless general data networks, such as any suitable type of Ethernet network, for example; via telecommunications/telephony networks such as analog voice networks or digital fiber communications networks, or via any other suitable type of network and/or protocol.

I/O controller(s) 310 may, in some embodiments, enable coupling to one or more display terminals, keyboards, keypads, touch screens, scanning devices, voice or optical recognition devices, and/or any other devices suitable for entering or retrieving data by one or more data processing system 300. Multiple input/output devices may be present in data processing system 300 or may be distributed on various nodes of data processing system 300. In some embodiments, similar I/O devices may be separate from data processing system 300 and may interact with data processing system 300 through a wired or wireless connection, such as over network interface 308.

As shown in FIG. 3, memory 304 may include program instructions 318 and data storage 320, comprising various data accessible by program instructions 318. Program instructions 318 may include executed programs of instructions including without limitation, programs implementing the methods illustrated in FIGS. 5-7. Program instructions 318 may be implemented in various embodiments using any desired programming language, scripting language, or combination of programming languages and/or scripting languages. Data storage 320 may include data that may be used by such program instructions 318 such as, for example, test probe configuration information.

A person of ordinary skill in the art will appreciate that data processing system 300 is merely illustrative and is not intended to limit the scope of the disclosure described herein. In particular, data processing system 300 and devices thereof may include any combination of hardware and/or software configured to perform and/or implement systems and methods described herein. In addition, the operations performed by the illustrated components may, in some embodiments, be performed by fewer components or distributed across additional components. Similarly, in other embodiments, the operations of some of the illustrated components may not be performed and/or other additional operations may be available. Accordingly, systems and methods described herein may be implemented or executed with other computer system configurations.

Embodiments of test configuration processor 102 described FIGS. 1-2 may be implemented in a computer system that is identical similar to data processing system 300. In some embodiments, elements described in FIG. 2 may be implemented in discrete hardware modules. Additionally or alternatively, some or all of such elements may be implemented in software-defined modules which may be executable by one or more of processors 302A-N, for example.

Figure 4:
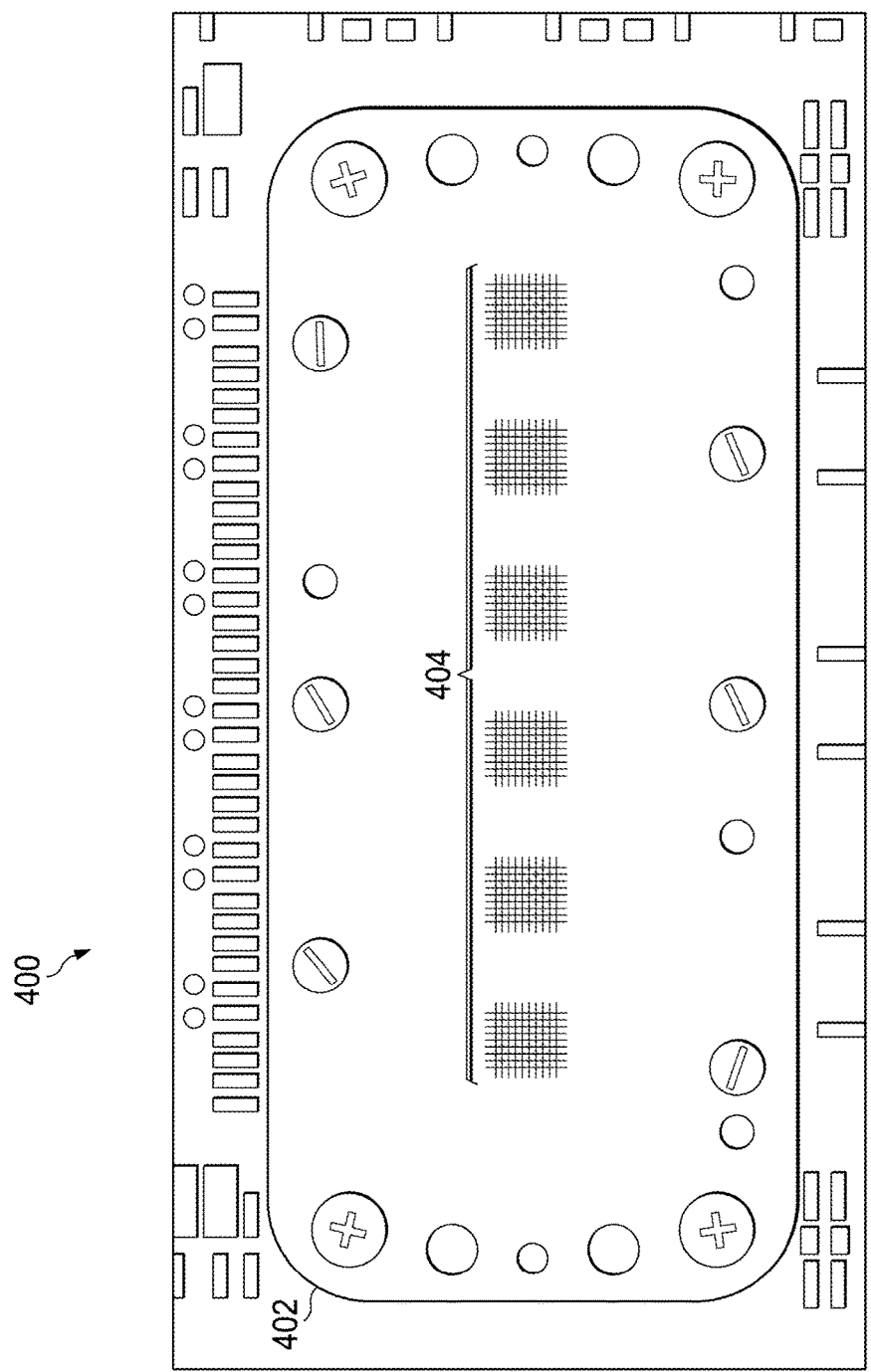
FIG. 4 is a diagram illustrating an example test probe, in accordance with embodiments of the present disclosure.

FIG. 4 is a diagram illustrating an example test probe 400, in accordance with embodiments of the present disclosure. In embodiments, test probe 400 may be used in testing device 112, for example. As shown, test probe 400 may include a printed circuit board (PCB) 402 or other device interface for receiving power from testing device 112 and conveying information to testing device 112. Additionally, test probe 400 may include a plurality of test contacts 404, each contact 404 including one or more test sites. For example, a test site may be a mini probe or metallic contact configured to touch down on a singulated semiconductor device at a predetermined position for collecting information about the operability of the singulated semiconductor device. This information may be relayed back to testing device 112 via PCB 402. Testing device 112 may include one or more processors for processing information collected by test probe 400. The processing time on testing device 112 may be very costly, and therefore, test configuration processor 102 may determine a test configuration that ensures that each of the contacts 404 probes a singulated semiconductor device on each touchdown of the probe, to the extent possible.

Figure 5:
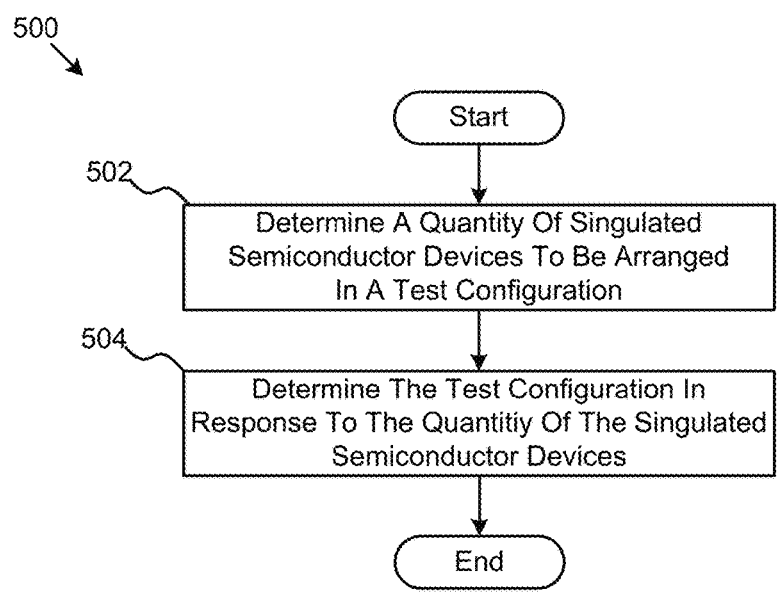
FIG. 5 is a flowchart diagram illustrating an example of a method for multi-site placement of singulated semiconductor devices, in accordance with embodiments of the present disclosure.

FIG. 5 is a flowchart diagram illustrating an example of a method 500 for multi-site placement of singulated semiconductor devices, in accordance with embodiments of the present disclosure. In some embodiments, method 500 may start when test configuration processor 102 determines a quantity of singulated semiconductor devices to be arranged as shown at block 502. Test configuration processor 102 may then determine a test configuration in response to the quantity as shown at block 504, after which method 500 may end.

In various embodiments, as described below, the test configuration processor 102 may use additional information, such as test probe information collected by test probe analyzer 204, lot information collected by lot analyzer 206, cost information collected by optimizer 208, scrap information collected by scrap analyzer 210, and the like to further inform the test configuration determination step of block 504.

Figure 6:
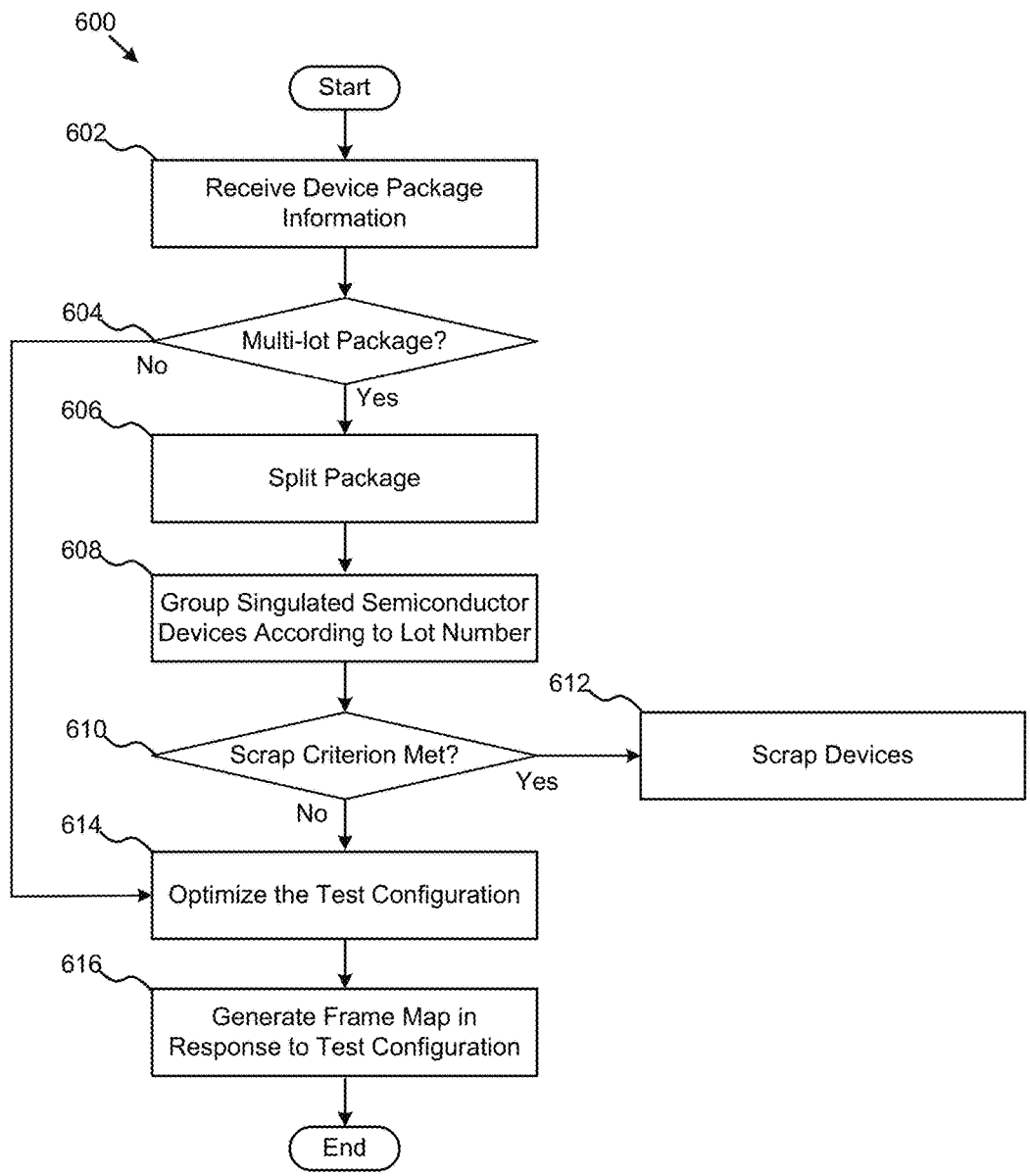
FIG. 6 is a flowchart diagram illustrating another example of a method for multi-site placement of singulated semiconductor devices, in accordance with embodiments of the present disclosure.

For example, FIG. 6 is a flowchart diagram illustrating another example of a method 600 for multi-site placement of singulated semiconductor devices, in accordance with embodiments of the present disclosure. In some embodiments, method 600 may start at block 602 with quantity analyzer 202 receiving shipping package information associated with shipping package 104a. For example, the shipping package information may include a quantity of singulated semiconductor devices contained in shipping package 104a. Lot analyzer 206 may then determine, as shown at block 604, whether shipping package 104a is a multi-lot package containing singulated semiconductor devices belonging from distinct lots. If so, package separator 106 may split shipping package 104a according to the lot division as shown at block 606, and may group the singulated semiconductor devices according to their respective lot numbers as shown at block 608. If a scrap criterion is met at block 610—for example if there are too few devices from a given lot—then the devices may be scrapped at block 612. If not, then test configuration processor 102 may optimize the test configuration as shown at block 614. Similarly, test configuration processor 102 may optimize a test configuration at block 614, if it is determined that only a single lot of singulated semiconductor devices is contained in shipping package 104a. In a further embodiment, method 600 may include generating a frame map—for example as shown in FIG. 12—in response to the test configuration, as shown at block 616.

In other embodiments, a device designer or device manufacturer may provide a frame map to system 100. System 100 may place the singulated semiconductor devices into a test frame according to the instructions provided in the frame map. For example, FIG. 7 illustrates a method 700 where the frame map is generated by another party, but is received by system 100, in accordance with embodiments of the present disclosure.

Figure 7:
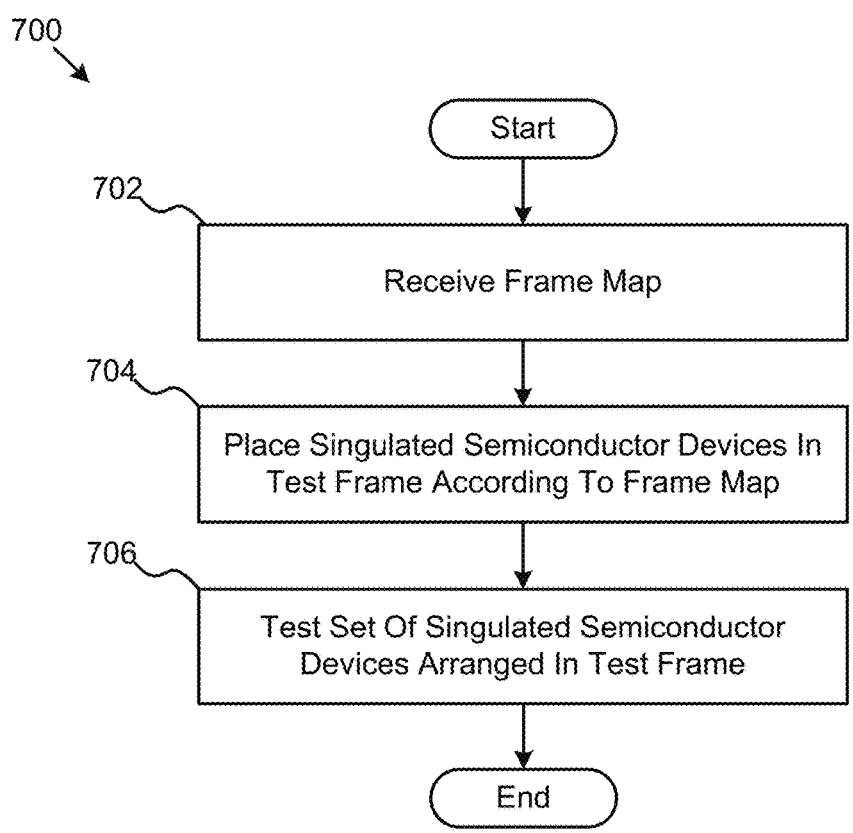
FIG. 7 is a flowchart diagram illustrating another example of a method for multi-site placement of singulated semiconductor devices, in accordance with embodiments of the present disclosure.

Method 700 of FIG. 7 may include receiving a frame map—for example a frame map as shown in FIG. 12—as shown at block 702. Placement device 108 may then place the singulated semiconductor devices on a test frame 110 according to the frame map as shown at block 704. Testing device 112 may then test the set of singulated semiconductor devices arranged in the test frame as shown at block 706. In some embodiments, device packager 116 may repackage the singulated semiconductor devices into shipping package 104b upon conclusion of the test(s).

It should be understood that the various operations described herein, particularly in connection with FIGS. 5-7, may be implemented by processing circuitry or other hardware components. The order in which each operation of a given method is performed may be changed, and various elements of the systems illustrated herein may be added, reordered, combined, omitted, modified, etc. It is intended that this disclosure embrace all such modifications and changes and, accordingly, the above description should be regarded in an illustrative rather than a restrictive sense.

Figure 8:
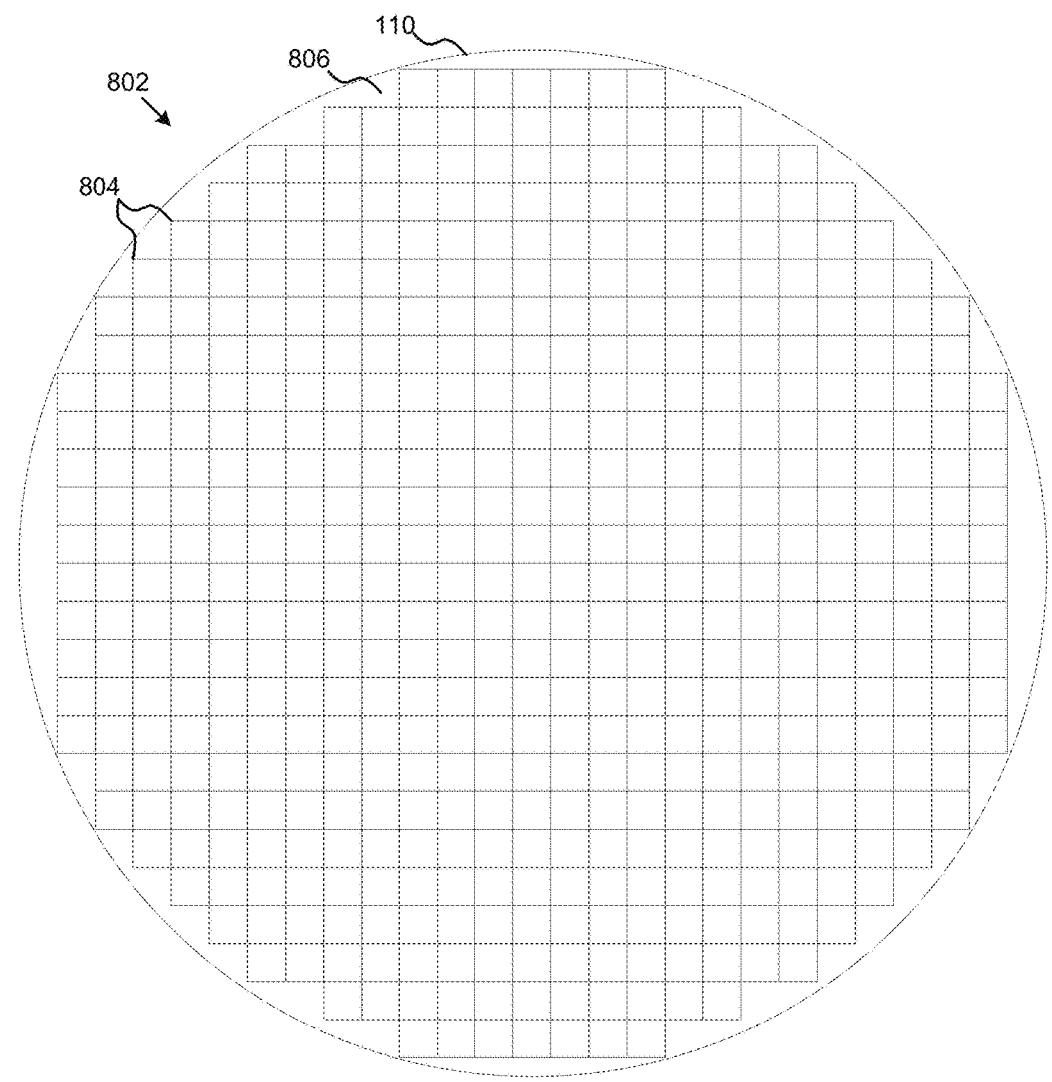
FIG. 8 is a diagram illustrating another example of a set of singulated semiconductor devices placed in a testing frame, in accordance with embodiments of the present disclosure.

FIG. 8 is a diagram illustrating an example test configuration 802 of singulated semiconductor devices 804 placed in a testing frame 110, in accordance with embodiments of the present disclosure. As shown in FIG. 8, a margin 806 of the testing frame 110 may be left unpopulated by the singulated semiconductor devices 804. The number of singulated semiconductor devices 804 placed by placement device 108 in each column and row may be determined according to the test configuration determined by the test configuration processor 102. For example, in an embodiment where test probe 400 includes a specific number of test sites 404, the number of singulated semiconductor devices 804 in each column or row may be equal to a multiple of the number of test sites 404 on test probe 400.

Figure 9:
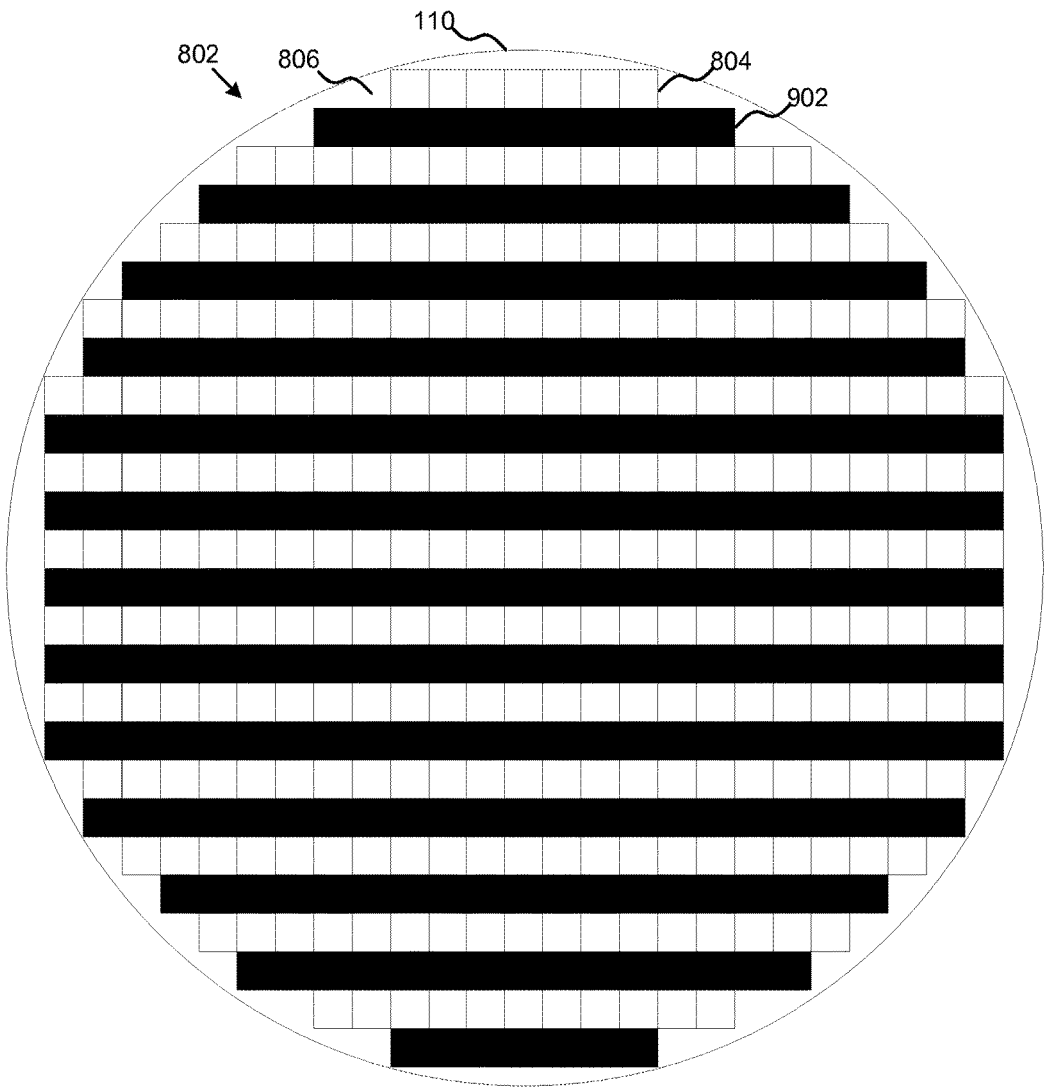
FIG. 9 is a diagram illustrating another example of a set of singulated semiconductor devices arranged with horizontal lateral spacing, in accordance with embodiments of the present disclosure.

FIG. 9 is a diagram illustrating an example test configuration 802 of singulated semiconductor devices 804 arranged with horizontal lateral spacing, in accordance with embodiments of the present disclosure. Singulated semiconductor devices 804 may be arranged in a test configuration 802. In order to optimize testing singulated semiconductor devices 804 may be arranged in rows with spacing 902 between rows. In some embodiments, spacing 902 may be approximately equal to the height/width of a singulated semiconductor device 804. In other embodiments, spacing 902 may be variable in order to optimize placement of singulated semiconductor devices 804 on test frame 110. Singulated semiconductor devices 804 may be arranged on the test frame 110 with a margin of space 806.

Figure 10:
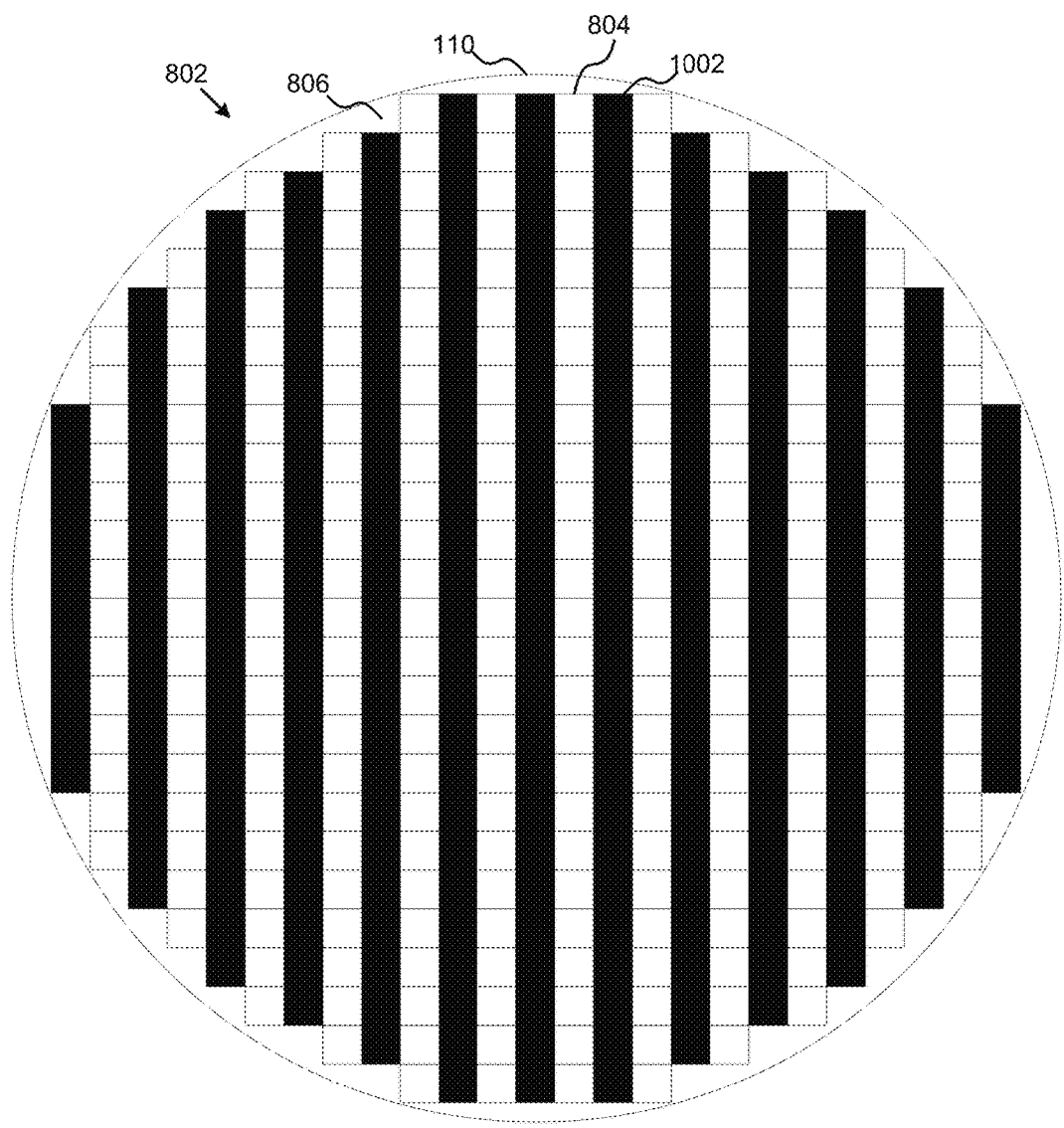
FIG. 10 is a diagram illustrating another example of a set of singulated semiconductor devices arranged with vertical lateral spacing, in accordance with embodiments of the present disclosure.

FIG. 10 is a diagram illustrating an example test configuration 802 of singulated semiconductor devices 804 arranged with vertical lateral spacing 1002. As shown in FIG. 10, lateral spacing 1002 may be of variable width depending on the configuration of test probe 400. Singulated semiconductor devices 804 may be arranged in test frame 110 in columns according to the test configuration generated by test configuration processor 102. The vertical lateral spacing may be selected to optimize testing of singulated semiconductor devices 804.

Figure 11:
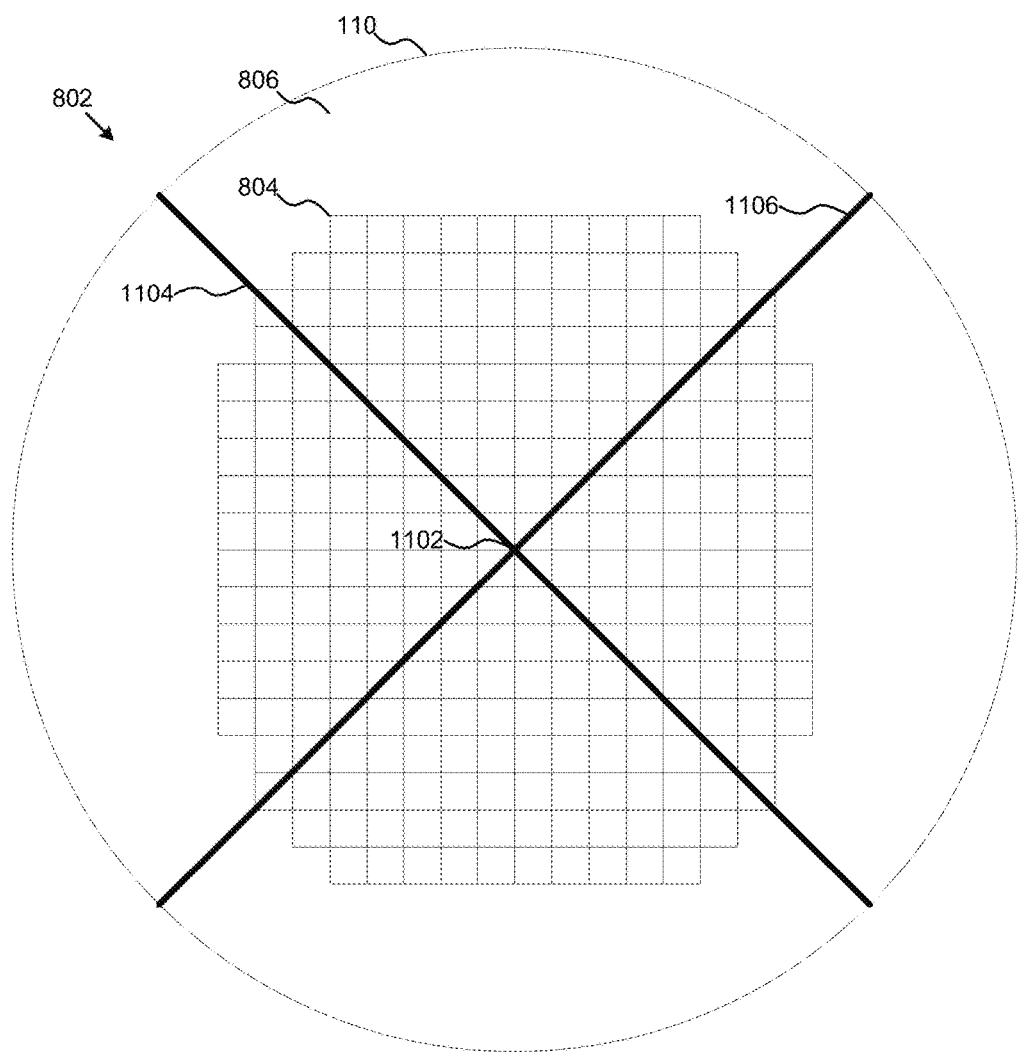
FIG. 11 is a diagram illustrating another example of a set of singulated semiconductor devices arranged around a reference point on the test frame, in accordance with embodiments of the present disclosure.

FIG. 11 is a diagram illustrating an example test configuration 802 of singulated semiconductor devices 804 arranged around a reference point 1102 on test frame 110. In an embodiment, reference point 1102 may be a point of intersection between a first axis 1104 and a second axis 1106 on test frame 110. In some embodiments, test configuration 802 may be arranged in a pattern that extends radially from reference point 1102. In such an embodiment, the margin 806 of the test frame 110 may be expanded. In still further embodiments, the reference point configuration of FIG. 11 may be combined with horizontal lateral spacing 902 of FIG. 9 or vertical lateral spacing 1002 of FIG. 10. Indeed, one of ordinary skill in the art may recognize a variety of alternative test configurations which may be suitable for use with a specific test probe 400 configuration.

FIG. 12 is a diagram illustrating an example of a frame map 1200 for multi-site placement of singulated semiconductor devices 804. In an embodiment, the frame map 1200 includes a plurality of rows 1202 and a plurality of columns 1204 defining cells. Each cell may represent a position on test frame 110 where singulated semiconductor devices 804 may be placed. As illustrated, cells may be populated with an indicator 1206-1208 for indicating whether a singulated semiconductor device 804 is to be placed at the corresponding position on the test frame 110. For example, the indicator may be a Boolean indicator such as a '1' or a '0,' a 'yes' or a 'no,' or as depicted an 'x' or a '0.' In the embodiment of FIG. 12, the 'x' indictor 1206 indicates that the corresponding position on test frame 110 is to be left empty, whereas a '0' indicator 1208 indicates that the corresponding position on test frame 110 is to be populated with a singulated semiconductor device 804.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

The invention claimed is:

1. A method, comprising:
   determining a quantity of singulated semiconductor devices to be tested;
   determining a test configuration in which to arrange the quantity of the singulated semiconductor devices, wherein the test configuration is based on the quantity of the singulated semiconductor devices, wherein the test configuration is arrangable on a test frame that allows multi-point test probing of the singulated semiconductor devices by a multi-point test probe that has a test probe configuration, and wherein the test configuration is further based on the test probe configuration and is configured to enhance utilization of the test probe;
   arranging the test configuration on the test frame; and
   performing multi-point test probing of the singulated semiconductor devices arranged on the test frame.

2. The method of claim 1, further comprising optimizing the test configuration to minimize a number of contacts by the test probe.

3. The method of claim 1, wherein the test probe is configured for testing of devices on a wafer before singulation, and the test configuration is configured to arrange the singulated semiconductor devices on a generally wafer-shaped test frame to allow the test probe to test the singulated semiconductor devices.

4. The method of claim 1, wherein determining the test configuration further comprises determining a spacing between the singulated semiconductor devices.

5. The method of claim 1, further comprising generating a frame map in response to the test configuration, the frame map defining an arrangement of the singulated semiconductor devices on the test frame.

6. The method of claim 5, wherein generating the frame map further comprises identifying a spacing of the singulated semiconductor devices along a first axis of the test frame.

7. The method of claim 6, wherein generating the frame map further comprises identifying a spacing of the singulated semiconductor devices along a second axis of the test frame.

8. The method of claim 5, wherein generating the frame map further comprises identifying a radial position of the singulated semiconductor devices with reference to a reference point on the test frame.

9. The method of claim 1, further comprising determining a quantity of singulated semiconductor devices in a lot set of singulated semiconductor devices.

10. The method of claim 9, further comprising designating the singulated semiconductor devices in the lot set as scrap in response to a determination that the quantity of singulated semiconductor devices in the lot set is below a threshold value.

11. The method of claim 1, further comprising designating the singulated semiconductor devices as scrap in response to a determination that an expected test yield is below a threshold value.

12. A system, comprising:
    a multi-point test probe that has a test probe configuration;
    a processing device configured to:
       determine a quantity of singulated semiconductor devices to be tested;
       determine a test configuration in which to arrange the quantity of the singulated semiconductor devices, wherein the test configuration is based on the quantity of the singulated semiconductor devices, wherein the test configuration is arrangable on a test frame that allows multipoint test probing of the singulated semiconductor devices by the multi-point test probe, and wherein the test configuration is further based on the test probe configuration and is configured to enhance utilization of the test probe; and
    a placement device configured to arrange the test configuration on the test frame;
    wherein the multi-point test probe is configured to perform multi-point test probing of the singulated semiconductor devices arranged on the test frame.

13. The system of claim 12, wherein the multi-point test probe is configured to contact the singulated semiconductor devices in the test frame and conduct an electrical test on multiple singulated semiconductor devices simultaneously.

14. The system of claim 12, further comprising a package separator configured to separate a first set of singulated semiconductor devices from a second set of singulated semiconductor devices.

15. The system of claim 14, wherein the first set of singulated semiconductor devices are manufactured in a first lot and the second set of singulated semiconductor devices are manufactured in a second lot.

16. A non-transitory machine-readable medium comprising machine-readable code that, when executed by a processing device, causes the processing device to perform operations comprising:
    determining a quantity of singulated semiconductor devices to be tested
    determining a test configuration in which to arrange the quantity of the singulated semiconductor devices, wherein the test configuration is based on the quantity of the singulated semiconductor devices, wherein the test configuration is arrangable on a test frame that allows multi-point test probing of the singulated semiconductor devices by a multi-point test probe that has a test probe configuration, and wherein the test configuration is further based on the test probe configuration and is configured to enhance utilization of the test probe;

causing the test configuration to be arranged on the test frame; and causing multi-point test probing of the singulated semiconductor devices arranged on the test frame.

* * * * *